United States Patent [19]

Kogan

[11] Patent Number: 4,809,051
[45] Date of Patent: Feb. 28, 1989

[54] VERTICAL PUNCH-THROUGH CELL

[75] Inventor: Grigory Kogan, Portland, Oreg.

[73] Assignee: National Semiconductor Corp., Santa Clara, Calif.

[21] Appl. No.: 82,797

[22] Filed: Aug. 6, 1987

[51] Int. Cl.$^4$ .......................................... H01L 29/78
[52] U.S. Cl. ..................................... 357/24; 357/51; 365/183
[58] Field of Search ........................ 357/24, 51, 23.6; 365/183

[56] References Cited

U.S. PATENT DOCUMENTS 4,471,368 9/1984 Mohsen .................................. 357/24
4,649,406 3/1987 Takemae .............................. 357/23.6

FOREIGN PATENT DOCUMENTS 60-198771 10/1985 Japan ..................................... 357/24

OTHER PUBLICATIONS

IBM Technical Disclosure Bulletin, vol. 15, #9, pp. 2887-2889 by Chang Feb. 1973.

Primary Examiner—Andrew J. James
Assistant Examiner—Mark Prenty
Attorney, Agent, or Firm—Limbach, Limbach & Sutton

[57] ABSTRACT

The present invention provides a vertical punch-through cell comprising a silicon substrate, an epitaxial silicon layer overlying the substrate, an N+ buried column line formed at the interface between the substrate and the epitaxial layer, an N+ diffusion region formed above and spaced apart from the buried column line at the surface of the epitaxial layer, a field oxide layer formed over the epitaxial layer and having an contact opening formed therein over the N+ diffusion region, a polysilicon layer formed on the surface of the field oxide layer to extend through the contact opening to make contact with the N diffusion region, a layer of dielectric material formed over the polysilicon layer, and a layer of conductive material formed over the dielectric material.

4 Claims, 1 Drawing Sheet

VERTICAL PUNCH-THROUGH CELL

BACKGROUND OF THE INVENTION

1. Field of the Invention

The present invention relates to integrated circuit devices and, in particular, to an improved vertical punch-through cell.

2. Discussion of the Prior Art

Vertical charge-coupled-device (CCD) or vertical punch-through cells become a cost-effective solution to memory design when further downscaling of MOSFETs is prevented by fundamental design and fabrication limitations. Neither vertical CCD nor vertical punch-through cells require transistors. Thus, these devices permit the development of higher density DRAMs without the need for downscaling of transistors.

FIGS. 1A and 1B illustrate a conventional vertical CCD cell. As best shown in FIG. 1B, a typical vertical CCD cell consists of a buried column 10 which is formed at the interface between a silicon substrate 12 and an overlying epitaxial silicon layer 14. A row line 16 is separated from the epitaxial layer 14 by a thin layer of dielectric material 18.

This designs suffers from several disadvantages. First, in a folded bit line configuration, wide spaces are required between the cells to avoid charge coupling between the CCD cell and the adjacent reference column. Second, the amount of stored charge in the conventional CCD cell is sensitive to threshold voltages. Third, the conventional cell is sensitive to surface defects over the gate dielectric area. Fourth, the conventional CCD device is sensitive to the type of gate dielectric material used.

SUMMARY OF THE INVENTION

The present invention provides a vertical punch-through cell which contains a polysilicon-to-metal, or alternatively, a polysilicon-to-polysilicon row capacitor and a buried column. The floating plate of the capacitor is connected to a diode.

A preferred embodiment of a vertical punch-through cell in accordance with the present invention comprises a silicon substrate, an epitaxial silicon layer overlying the substrate, an N+ buried column line formed at the interface between the substrate and the epitaxial layer, an N+ diffusion region formed above and spaced apart from the buried column line at the surface of the epitaxial layer, a field oxide layer formed over the epitaxial layer and having a contact opening formed therein over the N+ diffusion region, a polysilicon layer formed on the surface of the field oxide layer to extend through the contact opening to make contact with the N+ diffusion region, a layer of dielectric material formed over the polysilicon layer, and a layer of conductive material formed over the dielectric material.

DETAILED DESCRIPTION OF THE INVENTION

Figure 2A:
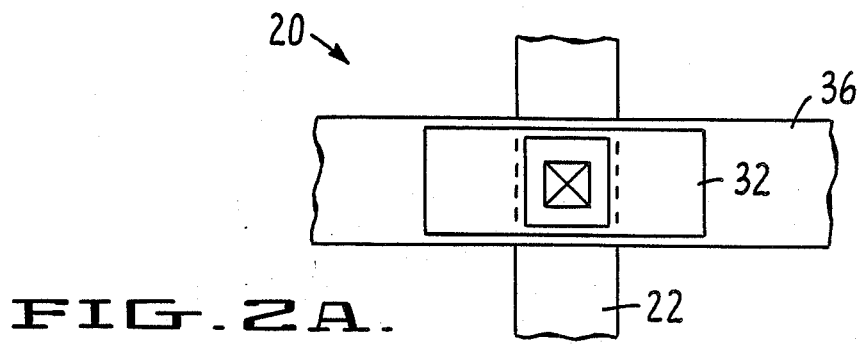
FIG. 2A is a simple layout illustrating a preferred embodiment of a vertical punch-through cell in accordance with the present invention.
Figure 2B:
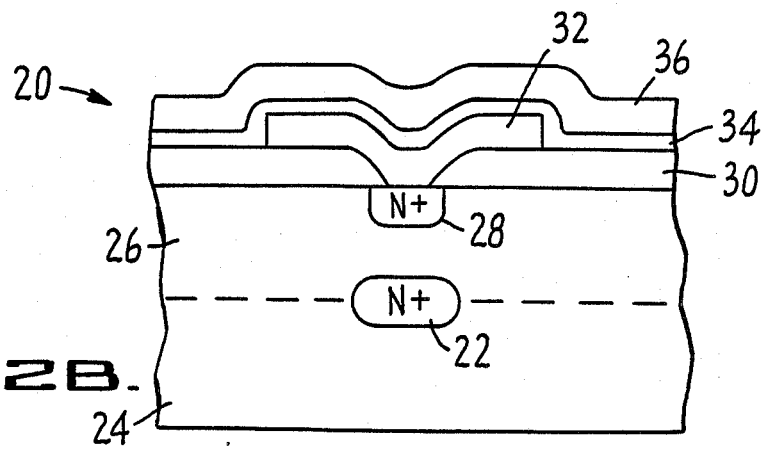
FIG. 2B is a cross-sectional view schematically illustrating the vertical punch-through cell shown in FIG. 2A.

As shown in FIGS. 2A and 2B, a vertical punch-through cell 20 in accordance with the present invention comprises an N+ buried column 22 formed at the interface between a silicon substrate 24 and an overlying epitaxial layer 26. An N+ diffusion region 28 is formed above and spaced apart from the buried column 22 at the surface of the epitaxial layer 26. A field oxide layer 30 is formed above the epitaxial layer 26 and patterned to provide contact between a polysilicon layer 32 and the N+ diffusion region 28. A silicon nitride dielectric layer 34 is then formed over the field oxide 30 and the polysilicon layer 32. A row line 36 of either metal or polysilicon is then formed above the dielectric layer 34.

Figure 1A:
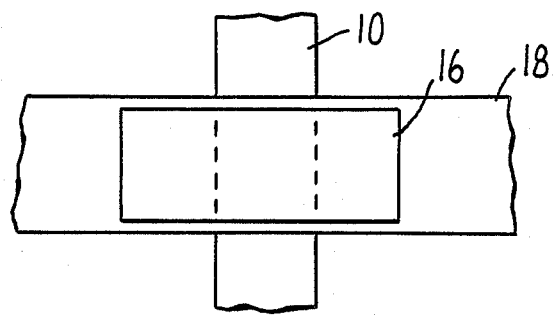
FIG. 1A is a simple layout illustrating a conventional vertical CCD cell.
Figure 1B:
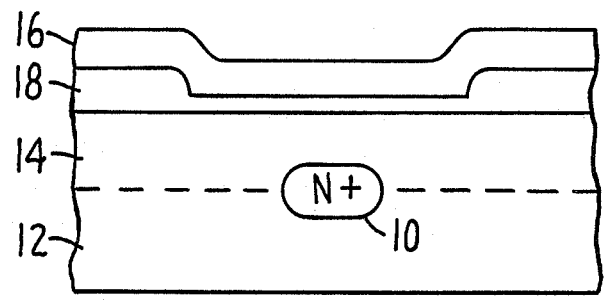
FIG. 1B is a cross-sectional view schematically illustrating the conventional vertical CCD cell shown in FIG. 1A.

While both cells function similarly, the vertical punch-through cell of the present invention has several advantages over the vertical CCD cell described in conjunction with FIGS. 1A and 1B above.

First, as stated above, the vertical CCD cell requires wide spaces between cells in a folded bit line configuration to avoid charge coupling between the cell and adjacent reference columns. This is not a limitation for the vertical punch-through cell because communication between the cell and the column is through a small diode area. Therefore, in the folded bit line configuration, a vertical punch-through cell in accordance with the present invention permits higher density than does the vertical CCD cell.

Second, the requirements for silicon surface quality are higher for the vertical CCD cell than for the vertical punch-through cell of the present invention. The vertical CCD cell is sensitive to all surface defects under the gate oxide. In the case of the vertical punch-through cell, however, it is important that the diode area occupy only a relatively small part of the cell's area. Therefore, at the same defect density, a vertical punch-through cell array in accordance with the present invention will provide higher yield than does the vertical CCD cell.

Third, the vertical CCD cell is sensitive to the type of gate dielectric material used. Usually, silicon dioxide is used in these applications because it provides better surface quality and a smaller threshold voltage than other dielectrics. In contrast, the vertical punch-through cell of the present invention can utilize any type of dielectric. For instance, silicon nitride may be used rather than silicon dioxide to provide a higher capacitance. Therefore, the capacitance of a vertical punch-through cell in accordance with the present invention can be made to be much higher than the capacitance of the vertical CCD cell.

Alternatively, the vertical CCD cell may suffer from breakdown of the thin dielectric more than does the vertical punch-through cell of the present invention. For example, assume a vertical CCD cell uses silicon dioxide as the dielectric, with a dielectric constant $E_{ox}=4$, and having a capacitance per unit area $$C_{ox}=(E_{ox} \cdot E_o)/t_{ox}$$

where $E_o$ is the permitivity of the free space ($E_o \simeq 8.86 \times 10^{-14}$ f/m), and $t_{ox}$ is the thickness of the silicon dioxide. Similarly, assume a vertical punch-through cell utilizing silicon nitride dielectric, with a dielectric constant $E_{ni} \simeq 8$, and having a capacitance per unit area $$C_{ox} = (E_{ox} \cdot E_o)/t_{ni}$$

where $t_{ni}$ is the thickness of the silicon nitride. To have the same performance, the two cells must have equal capacitances, i.e.

$$C_{ox} = (4 \cdot E_o)/t_{ox} = C_{ni} = (8 \cdot E_o)/t_{ni}.$$

Therefore, $t_{ox} = \frac{1}{2} t_{ni}$. Thus, at equal voltages $V_o$ across the capacitors, the electric field in the oxide will be $$E_{ox} = (V_o/t_{ox}) = (V_o \cdot 2)/t_{ni},$$

or twice as large as in the nitride. Therefore, breakdown of the silicon dioxide dielectric will be more possible in the CCD cell.

Therefore, a vertical punch-through cell in accordance with the present invention provides better parameters and more flexibility for a design than does the vertical CCD cell.

It should be understood that various alternatives to the embodiment of the invention described herein may be employed in practicing the invention. It is intended that the following claims define the scope of the invention and that the structure within the scope of these claims and their equivalents be covered thereby.

What is claimed is:

1. A vertical punch-through cell comprising:
   (a) a silicon substrate;
   (b) an epitaxial silicon layer overlying the substrate;
   (c) an N+ buried column line formed at the interface between the substrate and the epitaxial layer;
   (d) an N+ diffusion region formed above and spaced apart from the buried column line at the surface of the epitaxial layer;
   (e) a field oxide layer formed over the epitaxial layer and having a contact opening formed therein over the N+ diffusion region;
   (f) a polysilicon layer formed on the surface of the field oxide layer to extend through the contact opening to make contact with the N+ diffusion region;
   (g) a layer of dielectric material formed over the polysilicon layer; and
   (h) a layer of conductive material formed over the layer dielectric material.

2. A vertical punch-through cell as in claim 1 wherein the dielectric material is silicon nitride.

3. A vertical punch-through cell as in claim 2 wherein the conductive material is metal.

4. A vertical punch-through cell as in claim 2 wherein the conductive material is polysilicon.

* * * * *